US012669233B2

(12) United States Patent
Funakura et al.

(10) Patent No.: US 12,669,233 B2
(45) Date of Patent: Jun. 30, 2026

(54) LIGHT-EMITTING DEVICE INCLUDING LIGHT-TRANSMISSIVE MEMBER DISPOSED ABOVE WAVELENGTH CONVERSION MEMBER VIA AIR LAYER

(71) Applicant: NICHIA CORPORATION, Anan (JP)

(72) Inventors: Yusaku Funakura, Tokushima (JP); Masato Aihara, Komatsushima (JP); Toru Taruki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/991,214

(22) Filed: Dec. 20, 2024

(65) Prior Publication Data
US 2025/0207757 A1     Jun. 26, 2025

(30) Foreign Application Priority Data
Dec. 22, 2023     (JP) ................................. 2023-216409

(51) Int. Cl.
F21V 7/00         (2006.01)
F21V 7/09         (2006.01)
             (Continued)

(52) U.S. Cl.
CPC .......... F21V 7/0025 (2013.01); F21V 7/0066 (2013.01); F21V 7/09 (2013.01);
             (Continued)

(58) Field of Classification Search
CPC ............. H10H 20/8506; H10H 20/856; H10H 20/8504; H10H 20/85
             (Continued)

(56) References Cited

U.S. PATENT DOCUMENTS 5,458,716 A  * 10/1995  Alfaro ................... H01L 23/057
                                                              257/796
7,717,589 B2 *  5/2010  Nishioka ............ H10H 20/8515
                                                              362/334
(Continued)

FOREIGN PATENT DOCUMENTS

JP          2017-527948 A       9/2017
JP          2017-533590 A       11/2017
             (Continued)

*Primary Examiner* — Laura K Tso
(74) *Attorney, Agent, or Firm* — Spencer Fane LLP

(57)                ABSTRACT
A light-emitting device includes first and second portions. The first portion includes a light-emitting element, a wavelength conversion member, and a first reflective member covering lateral surfaces of the light-emitting element and the wavelength conversion member. The second portion includes a light-transmissive member disposed above the wavelength conversion member via an air layer, and a second reflective member disposed around the light-transmissive member. An upper surface of the first reflective member has a first upper surface disposed around the wavelength conversion member and a second upper surface disposed outwardly of the first upper surface. A lower surface of the second reflective member has a first lower surface disposed around the light-transmissive member and a second lower surface disposed outwardly of the first lower surface. The air layer extends between the first upper surface of the first reflective member and the first lower surface of the second reflective member.

14 Claims, 12 Drawing Sheets

(51) Int. Cl.
    *F21V 9/30*         (2018.01)
    *H10H 20/85*       (2025.01)
    *H10H 20/856*     (2025.01)

(52) U.S. Cl.
    CPC ............... *F21V 9/30* (2018.02); *H10H 20/85*
        (2025.01); *H10H 20/8504* (2025.01); *H10H*
        *20/8506* (2025.01); *H10H 20/856* (2025.01)

(58) Field of Classification Search
    USPC .......................................................... 362/84
    See application file for complete search history.

(56)           References Cited

U.S. PATENT DOCUMENTS

2004/0095063 A1*   5/2004   Murazaki ........... H10H 20/8513
                                           313/503

2010/0246159 A1*   9/2010   Wada ........................ F21K 9/00
                                    257/E21.599
2017/0155811 A1    6/2017   Jagt et al.
2017/0317251 A1   11/2017   Sweegers et al.
2018/0108815 A1    4/2018   Hayashi
2018/0315901 A1   11/2018   Lopez
2019/0326484 A1   10/2019   Welch et al.
2020/0144461 A1    5/2020   Hayashi
2021/0135065 A1    5/2021   Hayashi
2023/0072941 A1    3/2023   Miyairi et al.

FOREIGN PATENT DOCUMENTS

| JP | 2018-067630 A | 4/2018 |
| JP | 2018-531517 A | 10/2018 |
| JP | 2021-520064 A | 8/2021 |
| WO | 2021/166684 A | 8/2021 |

* cited by examiner

LIGHT-EMITTING DEVICE INCLUDING LIGHT-TRANSMISSIVE MEMBER DISPOSED ABOVE WAVELENGTH CONVERSION MEMBER VIA AIR LAYER

CROSS-REFERENCE TO RELATED APPLICATIONS

The present application claims priority under 35 U.S.C. § 119 to Japanese Patent Application No. 2023-216409, filed Dec. 22, 2023, the content of which is incorporated herein by reference in its entirety.

TECHNICAL FIELD

The present disclosure relates to a light-emitting device.

BACKGROUND

A structure in which a light-transmissive member is disposed over a wavelength conversion member via an air layer has been known (for example, Japanese Patent Application Publication No. 2018/531517 A).

SUMMARY

Further improvement of light extraction efficiency has been desired.

An embodiment of the present disclosure includes the following configuration. A light-emitting device includes a first portion and a second portion. The first portion includes a light-emitting element, a wavelength conversion member disposed on an upper surface of the light-emitting element, and a first reflective member covering a lateral surface of the light-emitting element and a lateral surface of the wavelength conversion member. The second portion includes a light-transmissive member disposed above the wavelength conversion member via an air layer, and a second reflective member disposed around the light-transmissive member in a plan view. An upper surface of the first reflective member has a first upper surface disposed around the wavelength conversion member and a second upper surface disposed outwardly of the first upper surface in the plan view. A lower surface of the second reflective member has a first lower surface disposed around the light-transmissive member and a second lower surface disposed outwardly of the first lower surface in the plan view. The air layer extends in a region between the first upper surface of the first reflective member and the first lower surface of the second reflective member.

The above allows manufacture of a light-emitting device with excellent light extraction efficiency.

BRIEF DESCRIPTION OF THE DRAWINGS

Figure 1A:
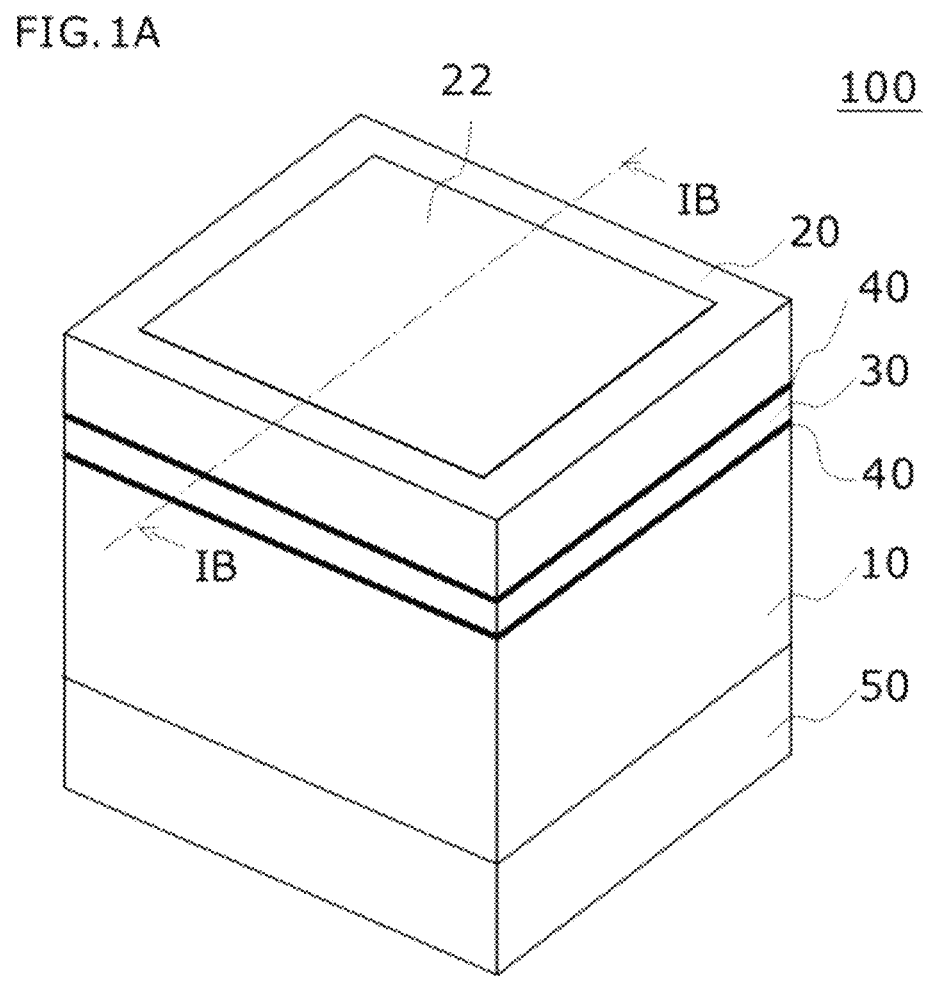

FIG. 1A is a schematic perspective view illustrating an example of a light-emitting device according to an embodiment.

FIG. 6 is a schematic cross-sectional view illustrating an example of the light-emitting device according to an embodiment.

DETAILED DESCRIPTION

Figure 1B:
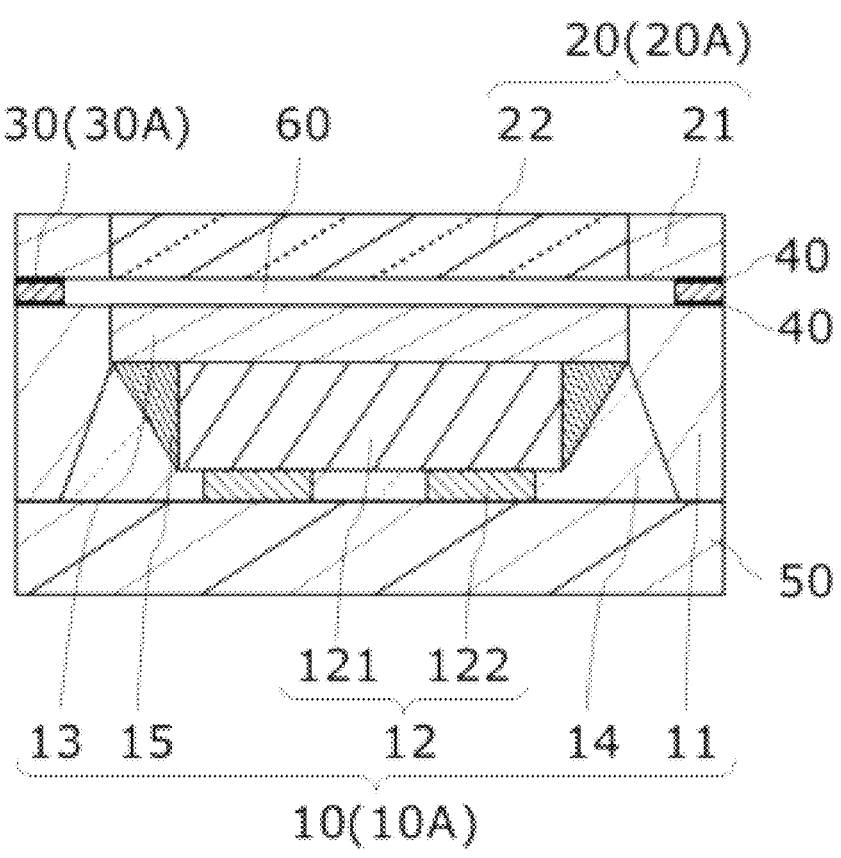
FIG. 1B is a schematic cross-sectional view taken along line IB-IB in FIG. 1A.

Embodiments of the present invention will be described in detail below with reference to the drawings. In the following description, the terms describing specific directions or positions (e.g., "upper", "lower", and other terms including those terms) are used, as necessary. The use of those terms is to facilitate understanding of the invention with reference to the drawings, and the technical scope of the present invention is not limited by the meaning of those terms.

Parts having the same reference characters appearing in a plurality of drawings indicate identical or equivalent parts or members. Furthermore, the following embodiments are examples of a light-emitting device to embody the technical concept of the present invention and do not limit the present invention to the following. The dimensions, materials, shapes, relative arrangements, and the like of the constituent members described below are not intended to limit the scope of the present invention only to those, but are intended to provide examples, unless otherwise specified. The contents to be described in an embodiment and an example can be applied to another embodiment and another example. The size, positional relationship, and the like of the members illustrated in the drawings can be exaggerated in order to clarify the explanation. The term "plan view" refers to viewing the light-emitting device from the upper or lower surface side, either directly or in a see-through manner. The term "cross-sectional view" refers to viewing a cross-section in a plan view taken along a cut surface passing through the center of the light-emitting device and including the first and second portions. A side closer to the center of the light-emitting device in a plan view is defined as an inner side, and a side closer to the lateral surface of the light-emitting device is defined as an outer side. An end view illustrating only a cut surface may be used as a schematic cross-sectional view.

A light-emitting device according to an embodiment includes a first portion including a light-emitting element, a wavelength conversion member disposed on an upper surface of the light-emitting element, and a first reflective member covering a lateral surface of the light-emitting element and a lateral surface of the wavelength conversion member, and a second portion including a light-transmissive member disposed above the wavelength conversion member via an air layer, and a second reflective member disposed around the light-transmissive member. The upper surface of the first reflective member includes a first upper surface disposed around the wavelength conversion member and a second upper surface disposed outwardly of the first upper surface. The lower surface of the second reflective member includes a first lower surface disposed around the light-transmissive member and a second lower surface disposed outwardly of the first lower surface. The air layer is also disposed between the first upper surface of the first reflective member and the first lower surface of the second reflective member. That is, the air layer is disposed not only between the upper surface of the wavelength conversion member and the lower surface of the light-transmissive member, but also between the first upper surface of the first reflective member and the first lower surface of the second reflective member. In other words, the air layer is exposed to the upper surface of the wavelength conversion member and the first upper surface of the first reflective member of the first portion, and is also exposed to the lower surface of the light-transmissive member and the first lower surface of the second reflective member of the second portion.

The wavelength conversion member is located above the light-emitting element, and the light-transmissive member is located above the wavelength conversion member via the air layer. A portion of light (first light) emitted from the light-emitting element and extracted from the upper surface of the wavelength conversion member passes through the air layer, enters the light-transmissive member, and is then extracted to the outside. A portion of the first light is reflected by the first lower surface of the second reflective member disposed around the light-transmissive member and travels downward (second light). After passing through the air layer again, the second light is made to irradiate the upper surface of the wavelength conversion member and the first upper surface of the first reflective member disposed around the wavelength conversion member. A portion of the second light travels upward again after being subjected to wavelength conversion by the wavelength conversion member, and the other portion of the second light is reflected by the first upper surface of the first reflective member, travels upward, and is extracted to the outside of the light-transmissive member. Thus, the light is repeatedly reflected by the first lower surface and the first upper surface, allowing the light to be efficiently extracted from the light-transmissive member. In addition, the portion of the second light reflected by the first lower surface is subjected to wavelength conversion by the wavelength conversion member, whereby the wavelength conversion efficiency can be improved. This allows reduction of the amount of a wavelength conversion substance contained in the wavelength conversion member.

The shape of the light-emitting device is a cubic shape or a rectangular parallelepiped shape. The rectangular parallelepiped shape can be a vertically or horizontally elongated rectangular parallelepiped. In such a case, the shape of the light-emitting device in a plan view is square or rectangular. That is, the first portion and the second portion have the same size and the same shape. However, the shape of the light-emitting device is not limited thereto and may be a cylindrical shape, an elliptic cylindrical shape, or a truncated cone shape, other than a cubic shape or a rectangular parallelepiped shape. For the size of the light-emitting device, for example, the length per side can be in a range from 1 mm to 10 mm when the plan view shape is quadrangular and the height can be in a range from 0.2 mm to 5 mm.

Individual components of the light-emitting device according to the embodiments are described in detail below with reference to the drawings.

First Embodiment

Figure 1C:
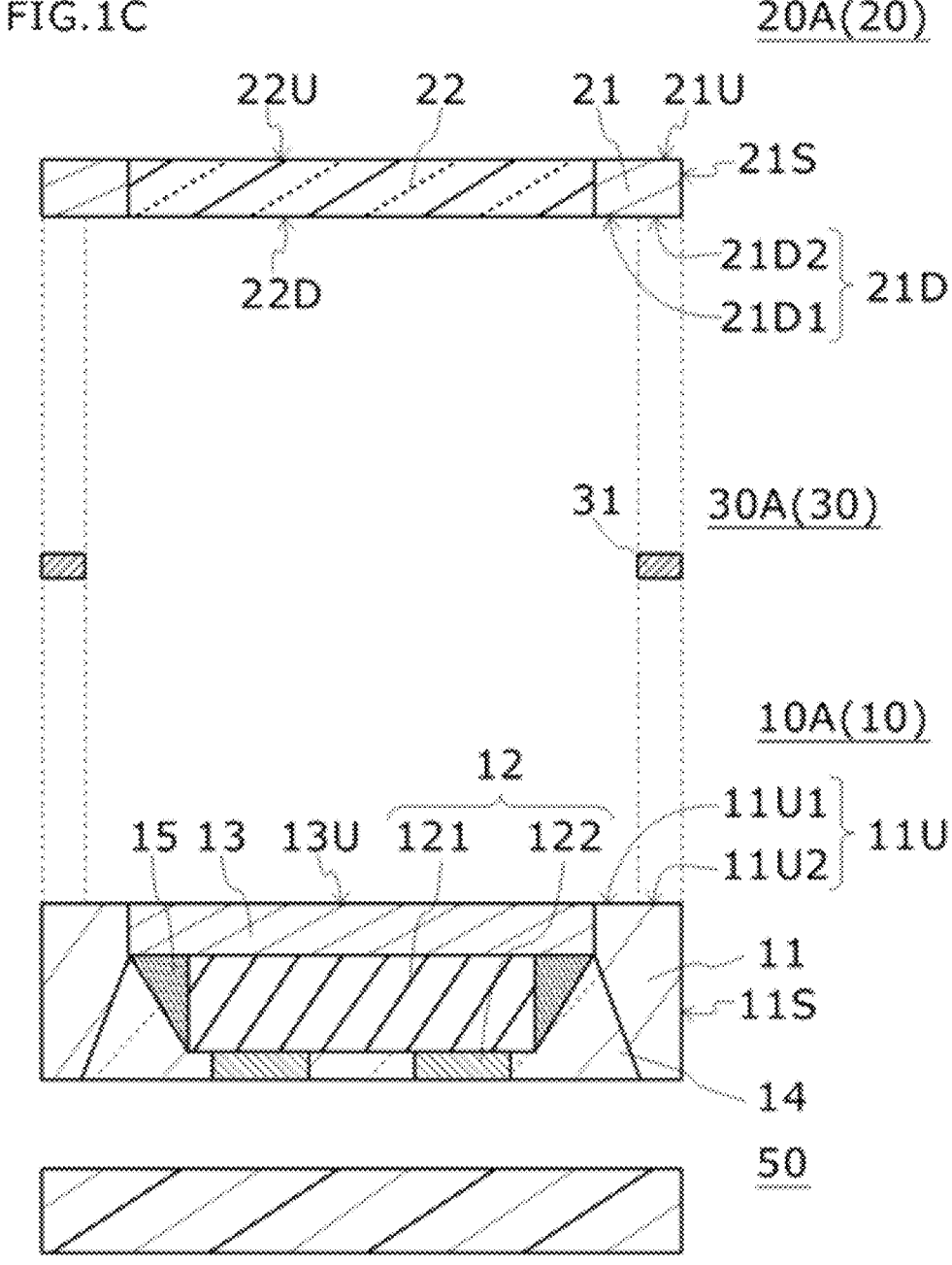
FIG. 1C is a schematic cross-sectional view illustrating a configuration of the light-emitting device according to the embodiment in an exploded manner.

An example of a light-emitting device 100 according to a first embodiment is illustrated in FIGS. 1A to 1C. The light-emitting device 100 includes a first portion 10 and a second portion 20 disposed above the first portion 10. In the first embodiment, the light-emitting device 100 further includes a third portion 30 disposed between the first portion 10 and the second portion 20, in addition to the first portion 10 and the second portion 20. An air layer 60 is disposed in a space surrounded by the upper surface of the first portion 10, the lower surface of the second portion 20, and an inner lateral surface 30M of the third portion 30. The first portion 10 and the third portion 30 are bonded with a bonding member 40. Similarly, the second portion 20 and the third portion 30 are bonded with the bonding member 40. The light-emitting device 100 further includes a substrate 50 electrically connected to the light-emitting element 12 via an electrically conductive connection member such as solder. The substrate 50 may be omitted.

The first portion 10 includes a light-emitting element 12, a wavelength conversion member 13 disposed on an upper surface of the light-emitting element 12, and a first reflective member 11 that covers a lateral surface of the light-emitting element 12 and a lateral surface of the wavelength conversion member 13. The second portion 20 includes a light-transmissive member 22 and a second reflective member 21 disposed around the light-transmissive member 22. The third portion 30 includes a third reflective member 31.

First Portion

The first portion 10 includes the light-emitting element 12, the wavelength conversion member 13 disposed on the upper surface of the light-emitting element 12, and the first reflective member 11 that covers the lateral surface of the light-emitting element 12 and the lateral surface of the wavelength conversion member 13. The first portion 10 can also include a light-transmissive light guide member 15 disposed between the light-emitting element 12 and the wavelength conversion member 13 and bonds them. The light guide member 15 may be provided between the light-emitting element 12 and a covering member 14. When the light-emitting device 100 includes the substrate 50, the covering member 14 can be disposed between the light-emitting element 12 and the substrate 50. Light emitted from the light-emitting element 12 enters the air layer 60 via the wavelength conversion member 13.

The light-emitting element 12 includes a semiconductor layered body 121 and a pair of positive and negative electrodes 122. The wavelength conversion member 13 is disposed on the upper surface of the semiconductor layered body 121 directly or via the light guide member 15. The first reflective member 11 covers the lateral surface of the wavelength conversion member 13 and the lateral surface of the light-emitting element 12. When the light guide member 15 and/or the covering member 14 is provided lateral to the light-emitting element 12, the first reflective member 11 indirectly covers the lateral surface of the light-emitting element 12 via the light guide member 15 and/or the covering member 14. The upper surface of the wavelength conversion member 13 and the upper surface of the first reflective member 11 constitute the upper surface of the second portion 20 and face the lower surface of the second portion 20. A lateral surface (outer lateral surface) 11S of the first reflective member 11 is the lateral surface of the first portion 10 and constitutes a part of the lateral surface of the light-emitting device 100. When the substrate 50 is provided, the first reflective member 11 covers the upper surface of the substrate 50. When the covering member 14 is not provided, the first reflective member 11 is also disposed between the upper surface of the substrate 50 and the lower surface of the light-emitting element 12.

The upper surface 11U of the first reflective member 11 includes a first upper surface 11U1 and a second upper surface 11U2. The first upper surface 11U1 is located on the outside, that is, on the outer periphery of the wavelength conversion member 13 in a plan view, and the second upper surface 11U2 is located at least on the outer periphery, that is, on the outside of the first upper surface 11U1. The first upper surface 11U1 is a surface that is exposed to the air layer 60. The second upper surface 11U2 is a surface that is in contact with the bonding member 40, but is not exposed to the air layer 60. The area of the first upper surface 11U1 in the upper surface 11U of the first reflective member 11 can be set, for example, in a range from 10% to 60% of the area of the upper surface 11U. The shape and the size of the second upper surface 11U2 of the first reflective member 11 substantially match the shape and the size of the lower surface of the third portion 30. At least a first lower surface 21D1 of the second reflective member 21 is disposed immediately above the first upper surface 11U1 of the first reflective member 11 via the air layer 60. The first lower surface 21D1 of the second reflective member 21 and a lower surface 22D of the light-transmissive member 22 may also be disposed immediately above the first upper surface 11U1 of the first reflective member 11 via the air layer 60.

Figures 2A, 2B:
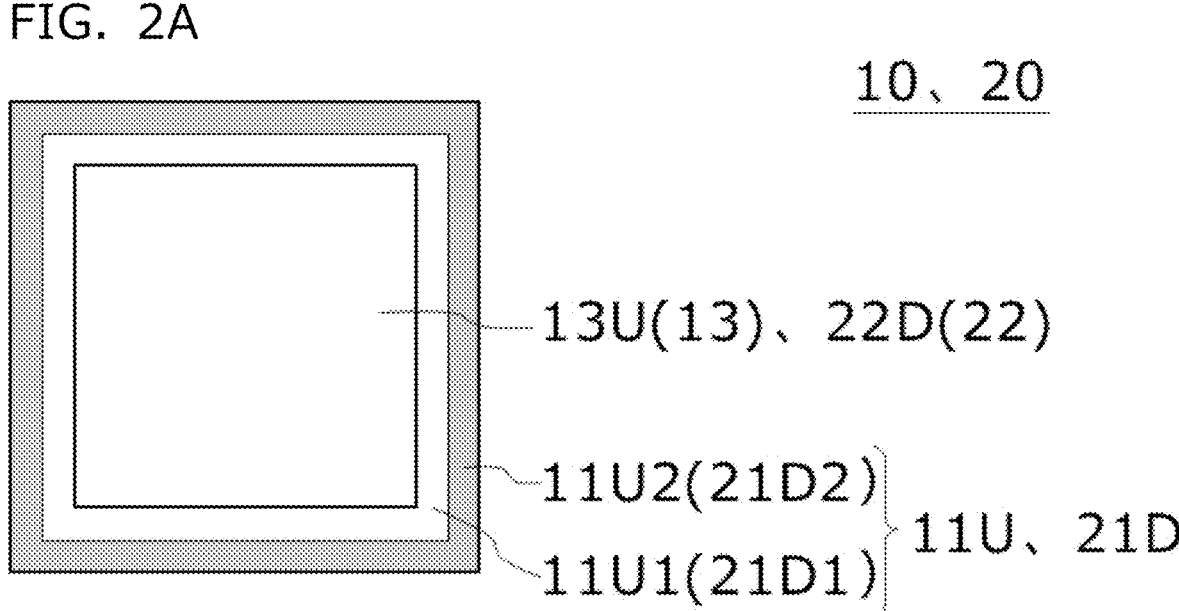
FIG. 2A is a schematic view of an arrangement example of a first upper surface and a second upper surface of a first reflective member of a first portion of the light-emitting device according to the embodiment, or an example of a first lower surface and a second lower surface of a second reflective member of a second portion of the light-emitting device.
FIG. 2B is a schematic view of an arrangement example of the first upper surface and the second upper surface of the first reflective member of the first portion of the light-emitting device according to the embodiment, or an example of the first lower surface and the second lower surface of the second reflective member of the second portion of the light-emitting device.
Figure 2C:
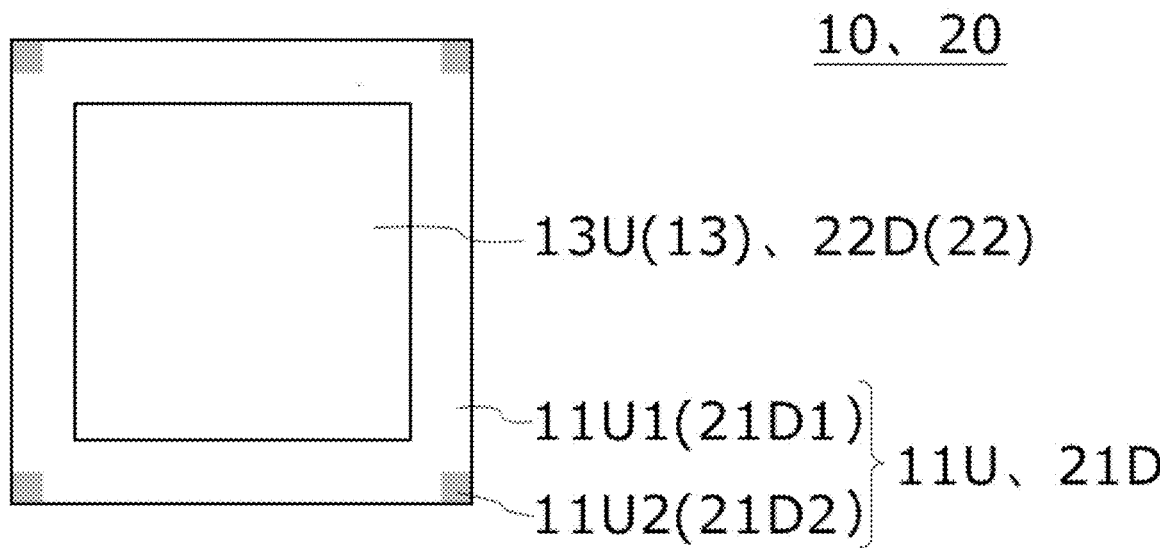
FIG. 2C is a schematic view of an arrangement example of the first upper surface and the second upper surface of the first reflective member of the first portion of the light-emitting device according to the embodiment, or an example of the first lower surface and the second lower surface of the second reflective member of the second portion of the light-emitting device.

FIGS. 2A to 2C illustrate arrangement examples of the first upper surface 11U1 and the second upper surface 11U2 of the upper surface 11U of the first portion 10. In the examples illustrated in FIGS. 2A to 2C, the upper surface 11U of the first reflective member 11 is disposed on the entire periphery, that is, along the entire periphery of the upper surface 13U of the wavelength conversion member 13. Here, an example in which the first portion 10 has a quadrangular shape in a plan view, and the upper surface 11U of the first reflective member 11 has an inner periphery and an outer periphery both in a quadrangular annular shape. A width (distance between the inner periphery and the outer periphery) of the upper surface 11U of the first reflective member 11 may be uniform or may be partially different. FIGS. 2A to 2C also illustrate arrangement examples of the first lower surface 21D1 and a second lower surface 21D2 of the lower surface 21D of the second portion 20, which will be described later.

In the example illustrated in FIG. 2A, the upper surface 11U of the first reflective member 11 includes the first upper surface 11U1 disposed on the entire periphery of the wavelength conversion member 13 and the second upper surface 11U2 disposed on the entire periphery, that is, along the entire periphery of the first upper surface 11U1. In other words, in a plan view, the upper surface 13U of the wavelength conversion member 13 is located in the central region of the first portion 10, the first upper surface 11U1 of the first reflective member 11 is located on the outer side of the upper surface 13U, and the second upper surface 11U2 is located on the further outer side of the first upper surface 11U1. The second upper surface 11U2 of the first reflective member 11 is not located on the inner side of the first upper surface 11U1.

Alternatively, the second upper surface 11U2 may be intermittently disposed along a periphery on an outside of the first upper surface 11U1 as shown in FIGS. 2B and 2C. In the examples illustrated in FIGS. 2B and 2C, the upper surface 11U of the first reflective member 11 has a plurality of second upper surfaces 11U2. In the example illustrated in FIG. 2B, the first upper surface 11U1 and the second upper surfaces 11U2 are located on opposing two sides (left and right sides in FIG. 2B). That is, the second upper surfaces 11U2 are located in two portions separated from the other. On the other two sides (upper and lower sides in FIG. 2B) between the above two sides (the left and right sides in FIG. 2B), except for both ends, only the first upper surface 11U1 is disposed.

In the example illustrated in FIG. 2C, the second upper surfaces 11U2 are located at four corners on the outer side of the first upper surface 11U1. That is, the second upper surfaces 11U2 are disposed at four portions separated from each other.

The first upper surface 11U1 and the second upper surface 11U2 of the first reflective member 11 may be located on the same plane, as in the first portion 10A illustrated in FIG. 1B and the like. As in a first portion 10B illustrated in FIG. 3A, the second upper surface 11U2 can be positioned lower than the first upper surface 11U1. In other words, the first reflective member 11 can include a first recessed portion 11R, which is a recessed portion recessed downward from the first upper surface 11U1 and has the second upper surface 11U2 as a lowermost surface (bottom surface).

Figure 3A:
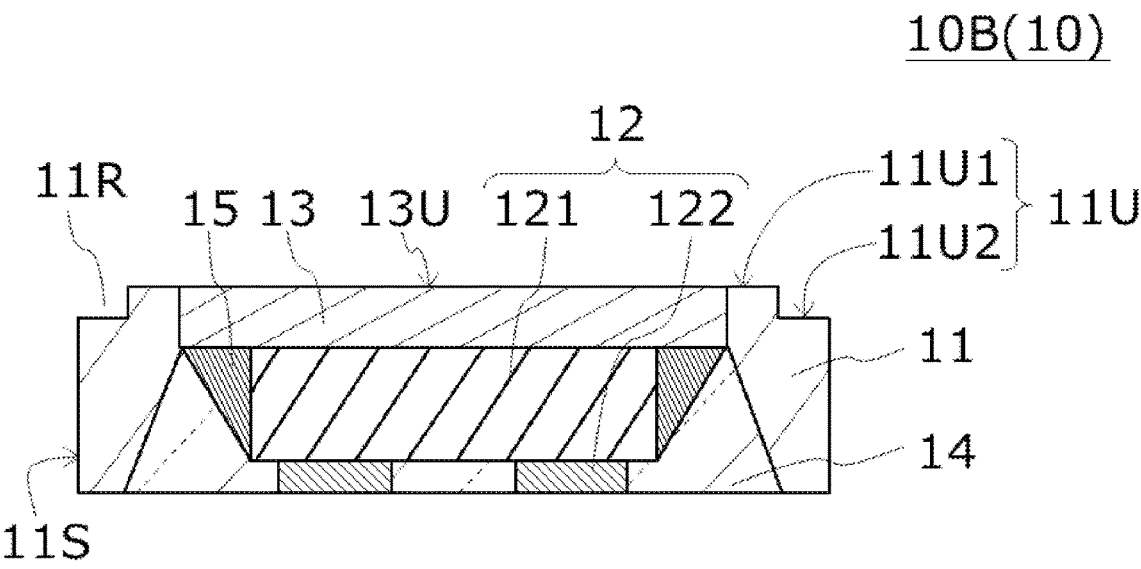
FIG. 3A is a schematic cross-sectional view illustrating an example of the first portion of the light-emitting device according to the embodiment.
Figure 3B:
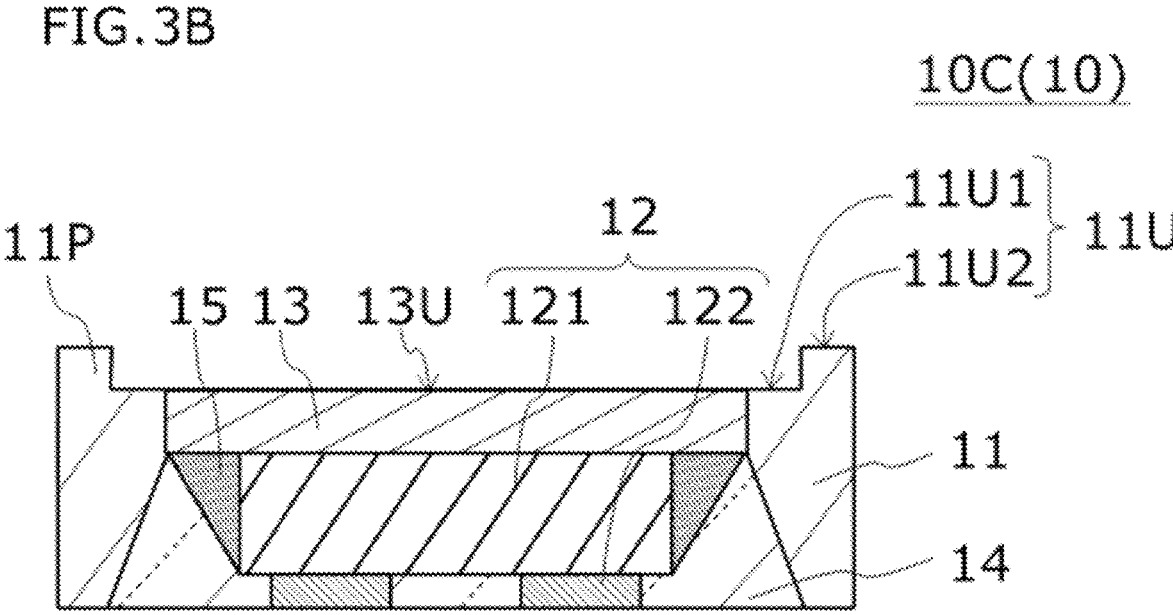
FIG. 3B is a schematic cross-sectional view illustrating an example of the first portion of the light-emitting device according to the embodiment.

Alternatively, like a first portion 10C illustrated in FIG. 3B, the second upper surface 11U2 can be positioned higher than the first upper surface 11U1. In other words, the first reflective member 11 can have a first projecting portion 11P which is a projecting portion projecting upward from the first upper surface 11U1 and has the second upper surface 11U2 as an uppermost surface (top surface).

The upper surface 11U of the first reflective member 11 of the first portion 10 may include only one of the first projecting portion 11P and the first recessed portion 11R, or may include both of them. In other words, only the second upper surface 11U2 disposed at a position higher than the first upper surface 11U1, or only the second upper surface 11U2 disposed at a position lower than the first upper surface 11U1 can be provided. Alternatively, both the second upper surface 11U2 disposed at a position higher than the first upper surface 11U1 and the second upper surface 11U2 disposed at a position lower than the first upper surface 11U1 may be provided. For example, as illustrated in FIG. 2A, when the second upper surface 11U2 is disposed on the entire periphery, that is, along the entire periphery of the first upper surface 11U1, the second upper surface 11U2 may be positioned higher than the first upper surface 11U1 on the two opposing sides (the left and right sides in FIG. 2A), and the second upper surface 11U2 can be positioned lower than the first upper surface 11U1 on the two sides (the upper and lower sides in FIG. 2A) between the two opposing sides (the left and right sides in FIG. 2A).

Second Portion

The second portion 20 includes the light-transmissive member 22 and the second reflective member 21 disposed around the light-transmissive member. An upper surface 22U of the light-transmissive member 22 and an upper surface 21U of the second reflective member 21 are surfaces that constitute a part of the upper surface of the second portion 20 and also constitute a part of the upper surface of the light-emitting device 100. The light-transmissive member 22 is a portion serving as the light-extracting surface of the light-emitting device 100. The second reflective member 21 is a member that holds the light-transmissive member 22. A lateral surface 21S of the second reflective member 21 constitutes the lateral surface of the second portion 20 and constitutes a part of the lateral surface of the light-emitting device 100. The lower surface 22D of the light-transmissive member 22 and the lower surface 21D of the second reflective member 21 are surfaces that constitute the lower surface of the second portion 20 and face the upper surface of the first portion 10.

The lower surface 21D of the second reflective member 21 includes the first lower surface 21D1 and the second lower surface 21D2. The first lower surface 21D1 is located on the outside, that is, on the outer periphery of the light-transmissive member 22 in a plan view, and the second lower surface 21D2 of the second reflective member 21 is located on the outside, that is, on the outer periphery of at least the first lower surface 21D1. The first lower surface 21D1 is a surface that is exposed to the air layer 60. The second lower surface 21D2 is a surface that is in contact with the bonding member 40 and is not exposed to the air layer 60. The area of the first lower surface 21D1 of the lower surface 21D of the second reflective member 21 can be set, for example, in a range from 10% to 60% of the area of the lower surface 21D. The shape and the size of the second lower surface 21D2 substantially match the shape and the size of the upper surface of the third portion 30. The first upper surface 11U1 of the first reflective member 11 is disposed immediately below the first lower surface 21D1 of the second reflective member 21 via the air layer 60. The first upper surface 11U1 of the first reflective member 11 and the upper surface 13U of the wavelength conversion member 13 may be disposed immediately below the first lower surface 21D1 of the second reflective member 21 via the air layer 60.

FIGS. 2A to 2C illustrate arrangement examples of the first lower surface 21D1 and the second lower surface 21D2 of the lower surface 21D of the second portion 20. In the examples illustrated in FIGS. 2A to 2C, the lower surface 21D of the second reflective member 21 is disposed on the entire periphery, that is, along the entire periphery of the lower surface 22D of the light-transmissive member 22.

Here, an example in which the second portion 20 has a quadrangular shape in a plan view, and the lower surface 21D of the second reflective member 21 has an inner periphery and an outer periphery both in a quadrangular annular shape. A width (a distance between the inner periphery and the outer periphery) of the lower surface 21D of the second reflective member 21 may be uniform or may be partially different.

In the example illustrated in FIG. 2A, the lower surface 21D of the second reflective member 21 includes the first lower surface 21D1 disposed on the entire periphery, that is, along the entire periphery of the light-transmissive member 22 and the second lower surface 21D2 disposed on the entire periphery, that is, along the entire periphery of the first lower surface 21D1. In other words, in a plan view, the lower surface 22D of the light-transmissive member 22 is located in the central region of the second portion 20, the first lower surface 21D1 of the second reflective member 21 is located on the outer side of the lower surface 22D, and the second lower surface 21D2 is located on the further outer side of the first lower surface 21D1. The second lower surface 21D2 of the second reflective member 21 is not located on the inner side of the first lower surface 21D1.

Alternatively, the second lower surface 21D2 may be intermittently disposed along a periphery on an outside of the first lower surface 21D1 as shown in FIGS. 2B and 2C. In the examples illustrated in FIGS. 2B and 2C, the lower surface 21D of the second reflective member 21 includes a plurality of second lower surfaces 21D2. In the example illustrated in FIG. 2B, the first lower surface 21D1 and the second lower surfaces 21D2 are located on the two opposing sides (the left and right sides in FIG. 2B). That is, the second lower surfaces 21D2 are disposed at two portions separated from each other. On the other two sides (upper and lower sides in FIG. 2B) between the above two sides (the left and right sides in FIG. 2B), except for both ends, only the first lower surface 21D1 is disposed.

In the example illustrated in FIG. 2C, the second lower surfaces 21D2 are located at four corners on the outer side of the first lower surface 21D1. That is, the second lower surface 21D2 is disposed at four portions separated from each other.

The first lower surface 21D1 and the second lower surface 21D2 of the second reflective member 21 can be located on the same plane as in the second portion 20A illustrated in FIG. 1B and the like. As in the second portion 20B illustrated in FIG. 4A, the second lower surface 21D2 may be positioned higher than the first lower surface 21D1. In other words, the second reflective member 21 can include a second recessed portion 21R which is a recessed portion recessed upward from the first lower surface 21D1 and has the second lower surface 21D2 as the uppermost surface (top surface).

Figure 4A:
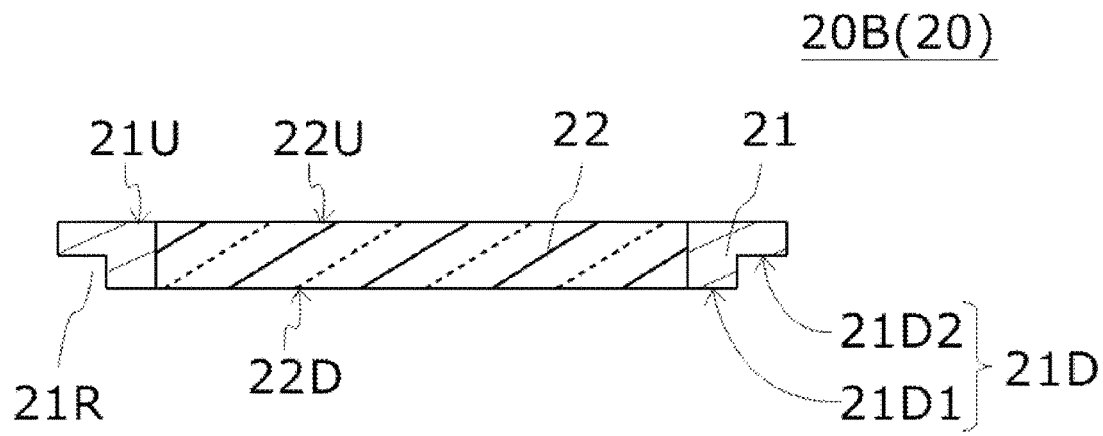
FIG. 4A is a schematic cross-sectional view illustrating an example of the second portion of the light-emitting device according to the embodiment.
Figure 4B:
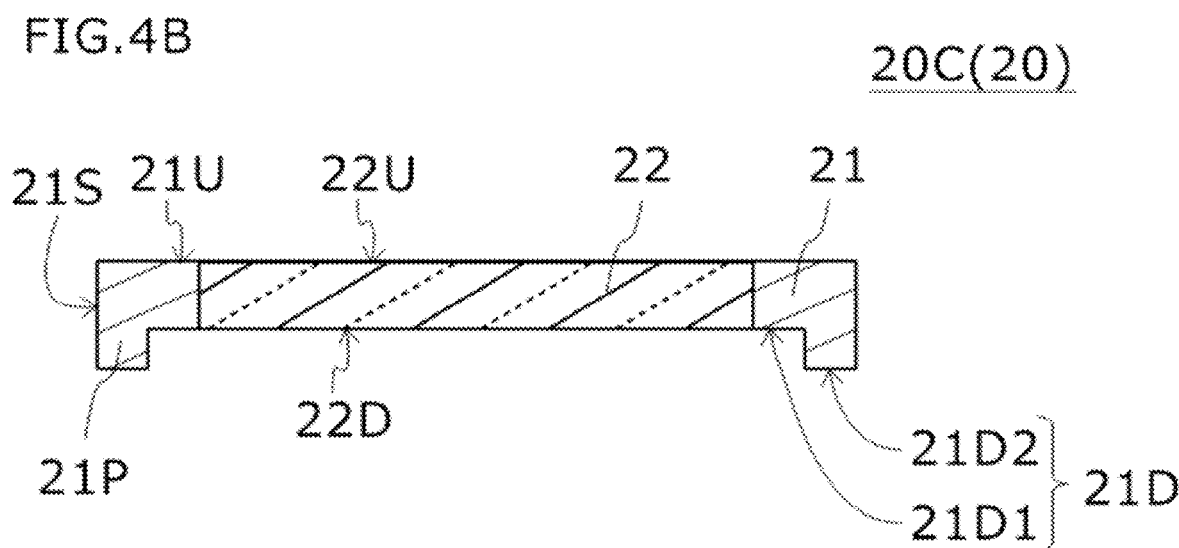
FIG. 4B is a schematic cross-sectional view illustrating an example of the second portion of the light-emitting device according to the embodiment.

Alternatively, as in the second portion 20C illustrated in FIG. 4B, the second lower surface 21D2 can be positioned lower than the first lower surface 21D1. In other words, the second reflective member 21 can include a second projecting portion 21P that is a projecting portion projecting downward from the first lower surface 21D1 and has the second lower surface 21D2 as the lowermost surface.

The lower surface 21D of the second reflective member 21 of the second portion 20 may include only one of the second projecting portion 21P and the second recessed portion 21R, or may include both of them. In other words, only the second lower surface 21D2 disposed at a position higher than the first lower surface 21D1 or only the second lower surface 21D2 disposed at a position lower than the first lower surface 21D1 can be provided. Alternatively, both the second lower surface 21D2 disposed at a position higher than the first lower surface 21D1 and the second lower surface 21D2 disposed at a position lower than the first lower surface 21D1 can be provided. For example, as illustrated in FIG. 2A, when the second lower surface 21D2 is disposed on the entire periphery, that is, along the entire periphery of the first lower surface 21D1, the second lower surface 21D2 may be positioned higher than the first lower surface 21D1 on the two opposing sides (the left and right sides in FIG. 2A), and the second lower surface 21D2 may be positioned lower than the first lower surface 21D1 on the two sides (the upper and lower sides in FIG. 2A) between the two opposing sides (the left and right sides in FIG. 2A).

Third Portion

The third portion 30 is disposed between the second upper surface 11U2 of the first reflective member 11 of the first portion 10 and the second lower surface 21D2 of the second reflective member 21 of the second portion 20 with the bonding member 40 interposed between the third portion 30 and each of the second upper surface 11U2 and the second lower surface 21D2. That is, the upper surface of the third portion 30 is bonded to the second lower surface 21D2 of the second reflective member 21 of the second portion 20, and the lower surface of the third portion 30 is bonded to the second upper surface 11U2 of the first reflective member 11 of the first portion 10. A lateral surface (outer lateral surface) 30S of the third portion 30 constitutes a part of the lateral surface of the light-emitting device 100. A lateral surface (inner lateral surface) 30M of the third portion 30 is exposed to the air layer 60.

Figure 5A:
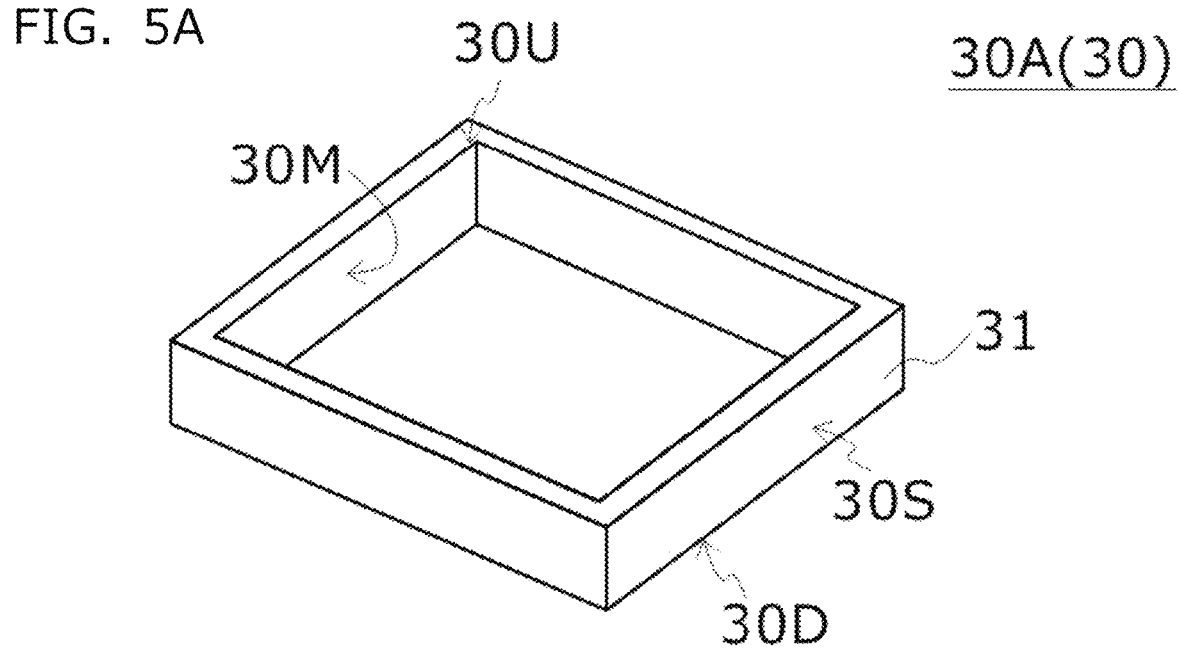
FIG. 5A is a schematic perspective view illustrating an example of a third portion of the light-emitting device according to the embodiment.

The shape of the lower surface 30D of the third portion 30 in a plan view matches the shape of the second upper surface 11U2 of the first reflective member 11 of the first portion 10. The shape of the upper surface 30U of the third portion 30 in a plan view matches the shape of the second lower surface 21D2 of the second reflective member 21 of the second portion 20. When the inner periphery and the outer periphery of the second upper surface 11U2 of the first reflective member 11 are both in a quadrangular annular shape, the third portion 30 in a plan view can have a shape in which the inner periphery and the outer periphery are both in a quadrangular annular shape as illustrated in FIG. 5A. In the case of such a shape, the light-emitting device 100 includes a single third portion 30. When the second upper surfaces 11U2 of the first reflective member 11 are disposed at portions of the periphery of the first upper surface 21U, that is, when the plurality of second upper surfaces 21U2 are provided, as illustrated in FIG. 2B or 2C, a plurality of columnar or wall-like third portions 30 can be provided. When the plurality of third portions 30 are provided, a part of the first reflective member 11 of the first portion 10 or a part of the second reflective member 21 of the second portion 20 can be disposed between adjacent ones of the third portions 30. Alternatively, the air layer 60 may be present between the adjacent ones of the third portions 30, that is, the air layer 60 may communicate with the outside. In such a case, for example, the air layer, when thermally expanded by heat generated by driving of the light-emitting device, can be discharged to the outside. This reduces damage to the second portion 20.

As illustrated in FIG. 3A, in the case of the first portion 10B in which the second upper surface 11U2 of the first reflective member 11 is positioned lower than the first upper surface 11U1, that is, when the first reflective member 11 includes the first recessed portion 11R recessed downward, the third portion 30 is disposed over the second upper surface 11U2 located in the first recessed portion 11R. In this case, the height of the third portion 30 needs to be greater than the depth of the first recessed portion 11R. As illustrated in FIG. 3B, when the second upper surface 11U2 of the first reflective member 11 is positioned higher than the first upper surface 11U1, that is, when the first reflective member 11 includes the first projecting portion 11P projecting upward, the third portion 30 is disposed over the second upper surface 11U2 that is the upper surface of the first projecting portion 11P.

As illustrated in FIG. 4A, when the second lower surface 21D2 of the second reflective member 21 is positioned higher than the first lower surface 21D1, that is, when the second reflective member 21 includes the second recessed portion 21R recessed upward, the third portion 30 is disposed under the second lower surface 21D2, which is the upper surface (top surface) of the second recessed portion 21R. In this case, the height of the third portion 30 needs to be greater than the depth of the second recessed portion 21R. As illustrated in FIG. 4B, when the second lower surface 21D2 of the second reflective member 21 is positioned lower than the first lower surface 21D1, that is, when the second reflective member 21 includes the second projecting portion 21P projecting downward, the third portion 30 is disposed under the second lower surface 21D2 that is the lower surface of the second projecting portion 21P.

Bonding Member

The bonding member 40 is disposed between the first portion 10 and the third portion 30 and bonds them and is disposed between the second portion 20 and the third portion 30 and bonds them. Specifically, the bonding member 40 is disposed between the second upper surface 11U2 of the first reflective member 11 of the first portion 10 and the lower surface 30D of the third portion 30. The bonding member 40 is also disposed between the second lower surface 21D2 of the second reflective member 21 of the second portion 20 and the upper surface 30U of the third portion 30. When the upper surface 11U of the first reflective member 11 of the first portion 10 includes the first recessed portion 11R, the bonding member 40 can also be disposed between the lateral surface defining the first recessed portion 11R and the lateral surface (inner lateral surface) 30M of the third portion 30. Similarly, when the lower surface 21D of the second reflective member 21 of the second portion 20 includes the second recessed portion 21R, the bonding member 40 can also be disposed between the lateral surface defining the second recessed portion 21R and the lateral surface (inner lateral surface) 30M of the third portion 30.

Figure 5B:
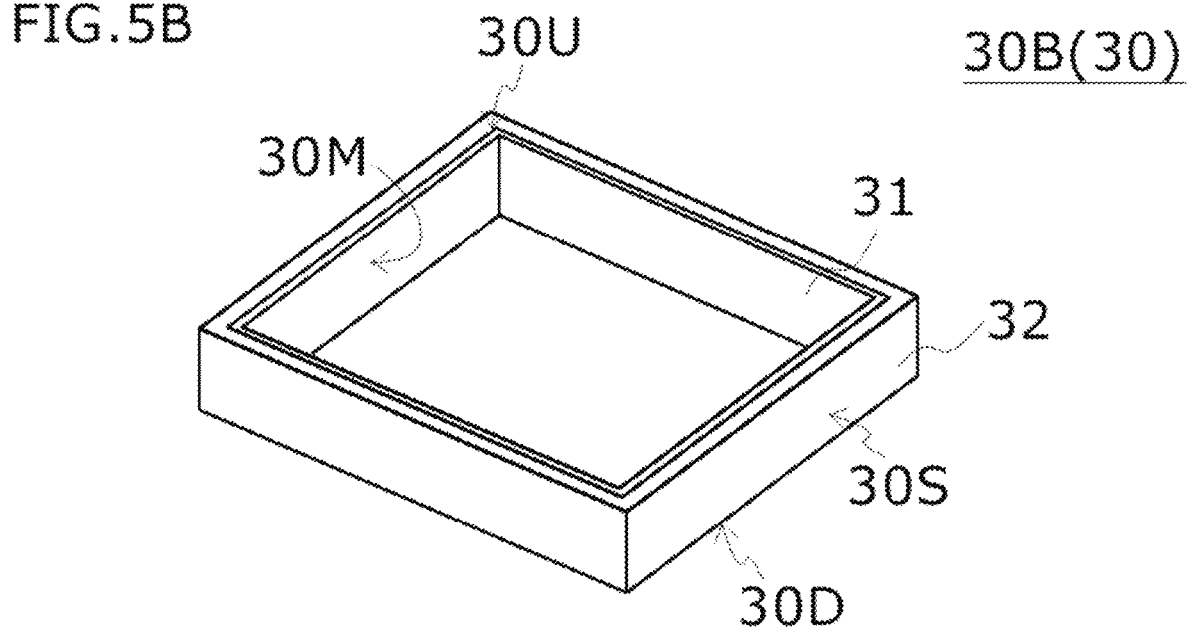
FIG. 5B is a schematic perspective view illustrating an example of the third portion of the light-emitting device according to the embodiment.

The third portion 30 includes the third reflective member 31. A third portion 30A illustrated in FIG. 5A is constituted only of the third reflective member 31. A third portion 30B illustrated in FIG. 5B may be constituted of the base 32 and the third reflective member 31. In this case, the third reflective member 31 is disposed at least on the side exposed to the air layer 60, that is, on the inner lateral surface 30M side. The third reflective member 31 may be disposed on a surface other than the inner lateral surface of the base 32.

Air Layer

The air layer 60 is disposed between the upper surface 13U of the wavelength conversion member 13 of the first portion 10 and the lower surface 22D of the light-transmissive member 22 of the second portion 20. In addition, the air layer 60 is also disposed between the first upper surface 11U1 of the first reflective member 11 of the first portion 10 and the first lower surface 21D1 of the second reflective member 21 of the second portion 20. In other words, the air layer 60 is disposed in contact with the upper surface 13U of the wavelength conversion member 13 and the first upper surface 11U1 of the first reflective member 11 of the first portion 10, in contact with the lower surface 22D of the light-transmissive member 22 and the first lower surface 21D1 of the second reflective member 21 of the second portion 20, and further in contact with the inner lateral surface 30M of the third portion 30.

The thickness of the air layer 60, that is, the distance between the upper surface 13U of the wavelength conversion member 13 and the lower surface 22D of the light-transmissive member 22 can be, for example, in a range from 10 μm to 500 μm.

The first portion 10, the second portion 20, and the third portion 30 may be of a combination of any of the shapes described above. For example, as illustrated in FIG. 1B, the light-emitting device 100 can be formed relatively easily by combining the first portion 10A having a flat upper surface, the second portion 20A having a flat lower surface, and the third portion 30A constituted only of the third reflective member 31. When using the first portion 10B (FIG. 3A) including the first recessed portion 11R in the upper surface or the second portion 20B (FIG. 4A) including the second recessed portion 21R in the lower surface, the third portion 30 can be disposed in those recessed portions to improve adhesion. Other combinations may also be used.

Second Embodiment

A light-emitting device according to a second embodiment includes the first portion 10 and the second portion 20 disposed above the first portion 10. The second embodiment is different from the first embodiment in that the third portion is not provided. In the second embodiment, a combination of the first portion 10 and the second portion 20 requires including either one of the first portion 10C (FIG. 3B) including the first projecting portion 11P on the upper surface 11U of the first reflective member 11 and the second portion 20C (FIG. 4B) including the second projecting portion 21P on the lower surface 21D of the second reflective member 21. By providing the projecting portion on either the first portion 10 or the second portion 20, the air layer 60 can be placed between the first portion 10 and the second portion 20.

Figure 6:
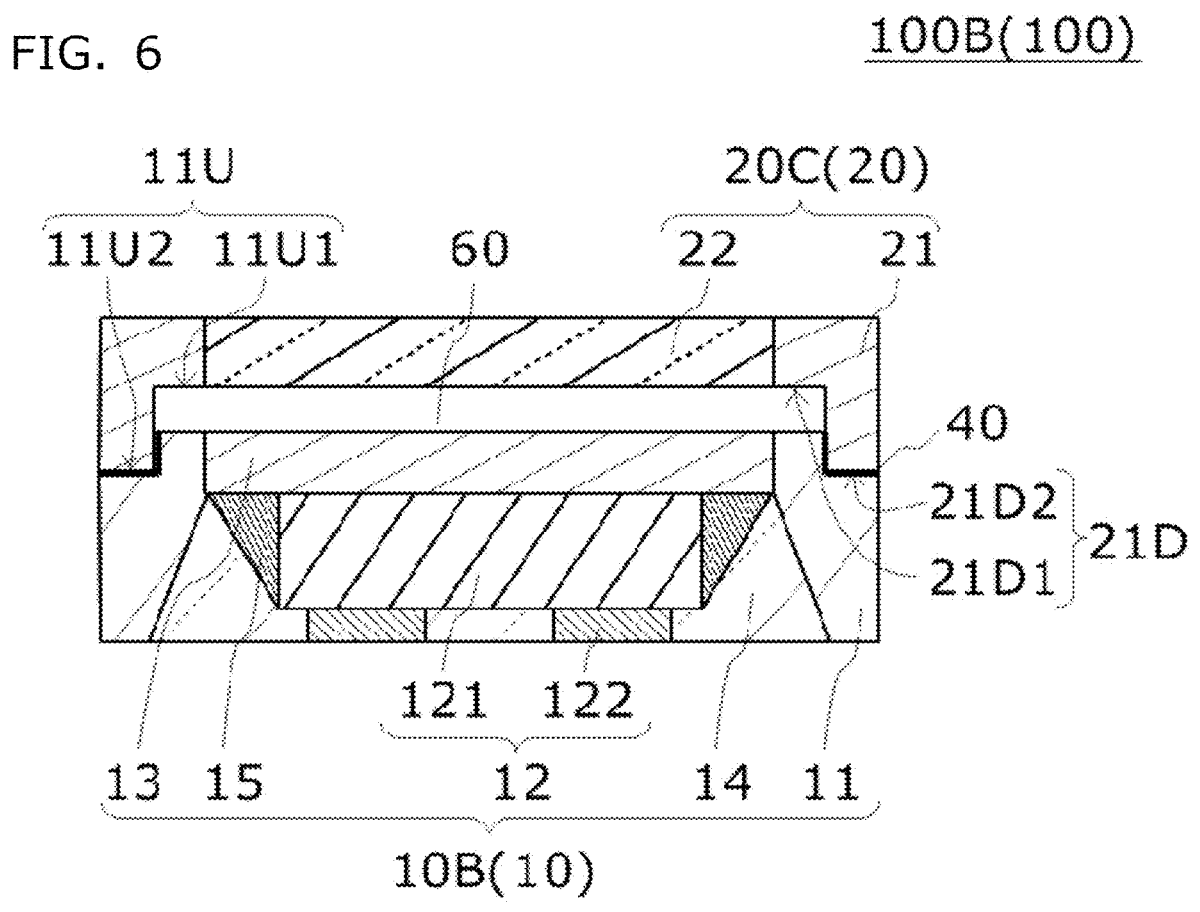

A light-emitting device 100B illustrated in FIG. 6 includes the first portion 10B in which the second upper surface 11U2 is positioned lower than the first upper surface 11U1 in the first reflective member 11, as illustrated in FIG. 3A. That is, the first portion 10B includes the first recessed portion 11R. Also included is the second portion 20C in which the second lower surface 21D2 is positioned lower than the first lower surface 21D1 in the second reflective member 21, as illustrated in FIG. 4B. That is, the second portion 20C includes the second projecting portion 21P. The height of the second projecting portion 21P (the distance between the first lower surface 21D1 and the second lower surface 21D2) is greater than the depth of the first recessed portion 11R (the distance between the first upper surface 11U1 and the second upper surface 11U2). The difference between these distances is a thickness of the air layer 60. By adjusting the depth of the first recessed portion 11R and the height of the second projecting portion 21P, the air layer 60 having a desired thickness can be provided.

Figure 7:
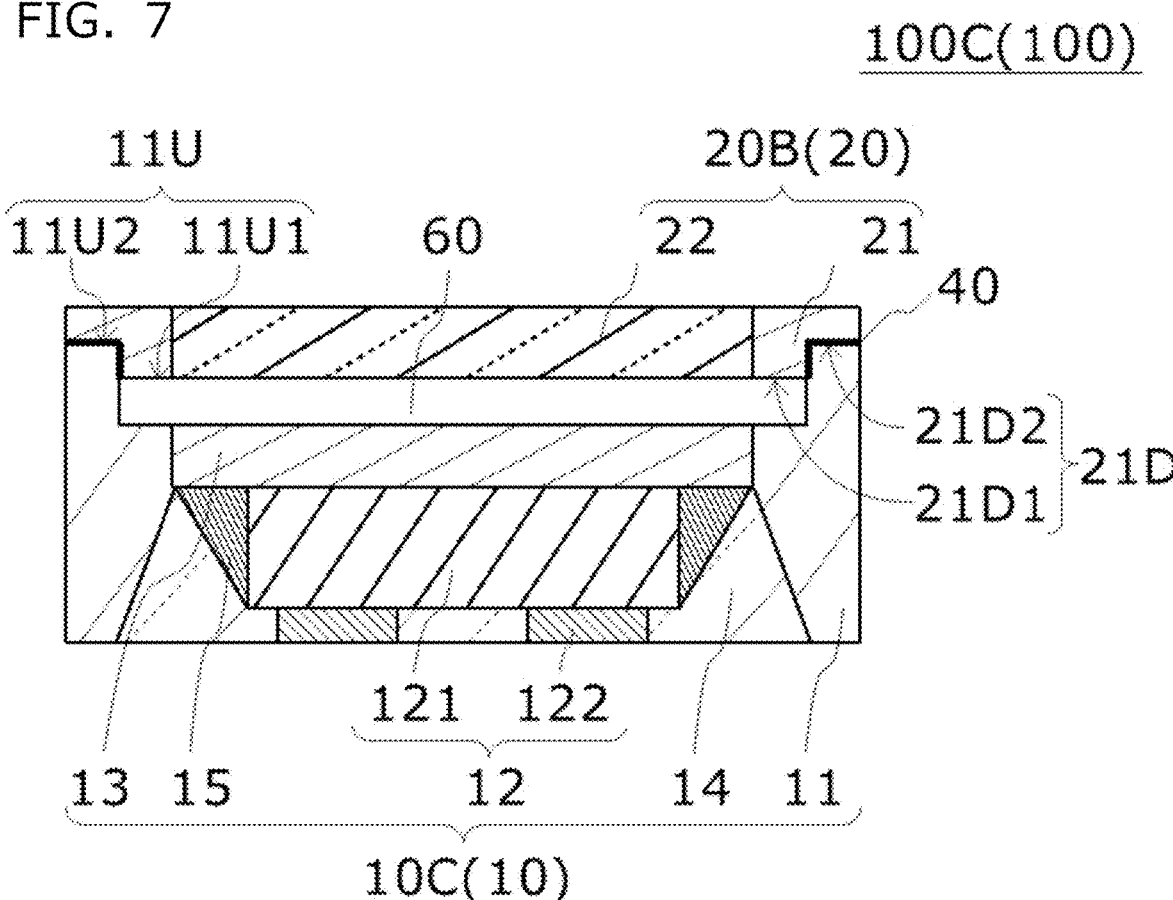
FIG. 7 is a schematic cross-sectional view illustrating an example of the light-emitting device according to the embodiment.

A light-emitting device 100C illustrated in FIG. 7 includes the first portion 10C in which the second upper surface 11U2 is positioned higher than the first upper surface 11U1 in the first reflective member 11, as illustrated in FIG. 3B. That is, the first portion 10C includes the first projecting portion 11P. Also included is the second portion 20B in which the second lower surface 21D2 is positioned higher than the first lower surface 21D1 in the second reflective member 21, as illustrated in FIG. 4A. That is, the second portion 20B includes the second recessed portion 21R. The height of the first projecting portion 11P (the distance between the first upper surface 11U1 and the second upper surface 11U2) is greater than the depth of the second recessed portion 21R (the distance between the first lower surface 21D1 and the second lower surface 21D2). The difference between these distances is a thickness of the air layer 60. By adjusting the depth of the second recessed portion 21R and the height of the first projecting portion 11P, the air layer 60 having a desired thickness can be provided.

Figure 8:
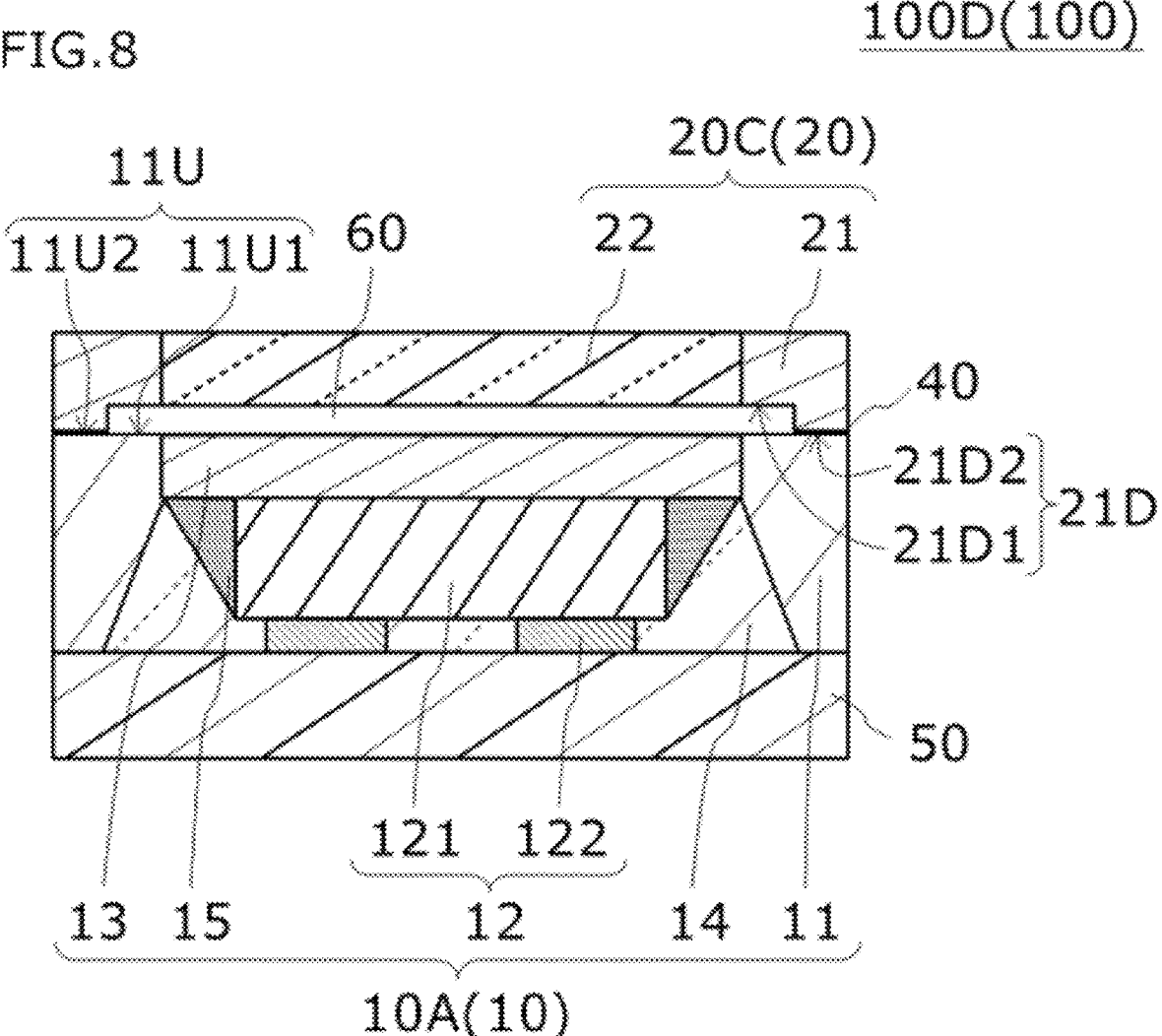
FIG. 8 is a schematic cross-sectional view illustrating an example of the light-emitting device according to the embodiment.

A light-emitting device 100D illustrated in FIG. 8 includes the first portion 10A in which the second upper surface 11U2 and the first upper surface 11U1 of the first reflective member 11 are located on the same plane, as illustrated in FIG. 1B. Also included is the second portion 20C in which the second lower surface 21D2 is positioned lower than the first lower surface 21D1 in the second reflective member 21, as illustrated in FIG. 4B. That is, the second portion 20C includes the second projecting portion 21P. The height of the second projecting portion 21P (the distance between the first lower surface 21D1 and the second lower surface 21D2) is a thickness of the air layer 60. By adjusting the height of the second projecting portion 21P, the air layer 60 having a desired thickness can be provided.

Figure 9:
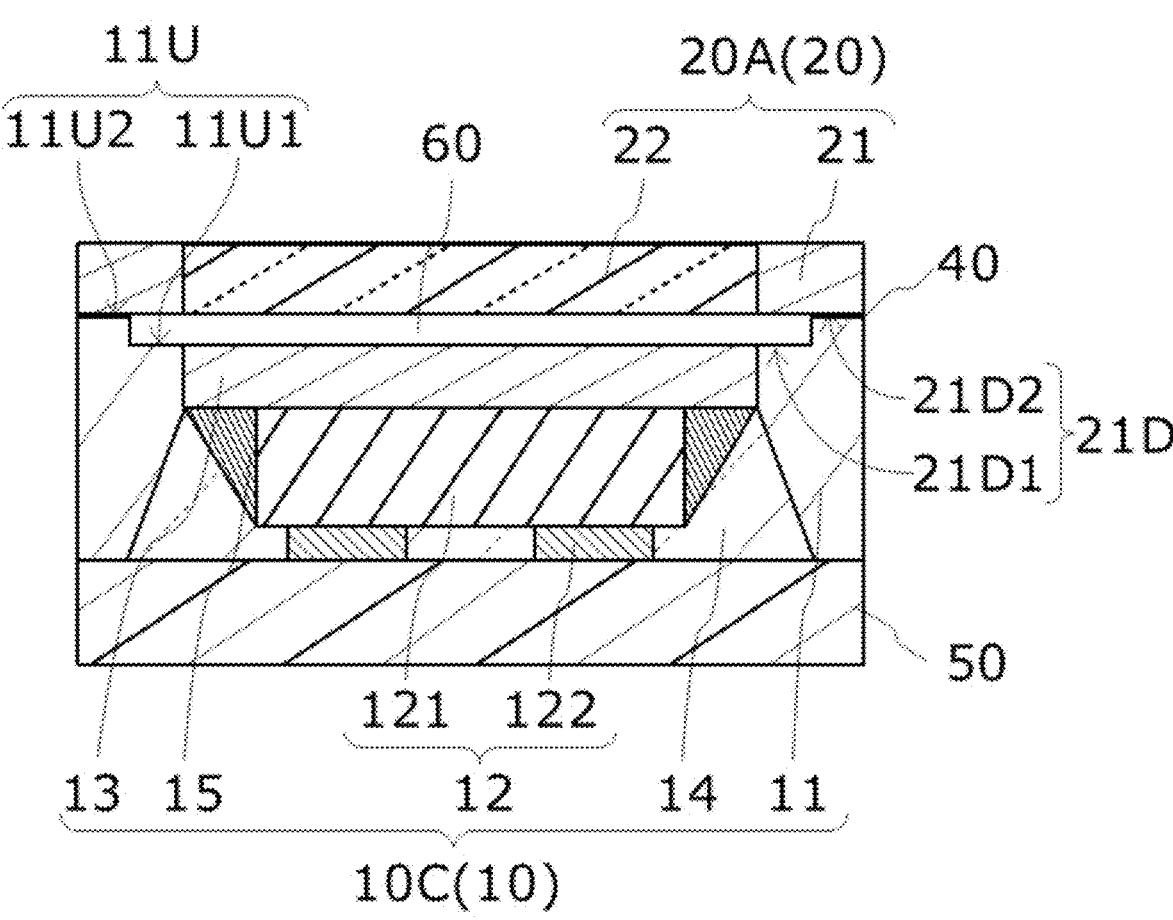
FIG. 9 is a schematic cross-sectional view illustrating an example of the light-emitting device according to the embodiment.

A light-emitting device 100E illustrated in FIG. 9 includes the first portion 10C in which the second upper surface 11U2 is positioned higher than the first upper surface 11U1 in the first reflective member 11, as illustrated in FIG. 3B. That is, the first portion 10C includes the first projecting portion 11P. Also included is the second portion 20A in which the second lower surface 21D2 and the first lower surface 21D1 in the second reflective member 21 are located on the same plane, as illustrated in FIG. 1B. The height of the first projecting portion 11P (the distance between the first upper surface 11U1 and the second upper surface 11U2) is a thickness of the air layer 60. By adjusting the height of the first projecting portion 11P, the air layer 60 having a desired thickness can be provided.

In addition to the above, the first portion 10C (FIG. 3B) and the second portion 20C (FIG. 4B) can be combined.

Other constituent members of the embodiments will be described in detail below.

Light-Emitting Element

The light-emitting device includes at least one light-emitting element 12. As the light-emitting element 12, a semiconductor light-emitting element such as a light-emitting diode can be used. The light-emitting element 12 includes the semiconductor layered body 121 and the pair of positive and negative electrodes 122. The semiconductor layered body 121 includes, for example, an element substrate made of sapphire or the like and a semiconductor layer formed thereon. Alternatively, the semiconductor layered body 121 need not include the element substrate and may be constituted only of a semiconductor layer. The shape of the light-emitting element 12 in a plan view can be a polygon such as a triangle, a quadrangle, or a hexagon. The size of the light-emitting element 12 can be, for example, in a range from 100 μm to 3000 μm per side in a plan view. Specifically, a square having a side of about 600 μm, about 1400 μm, about 1700 μm, or the like can be employed. The light-emitting element 12 may be a rectangular shape with long sides and short sides in a plan view. For example, the size can be 1100 μm×200 μm.

The semiconductor layered body 121 includes an n-type semiconductor layer, a p-type semiconductor layer, and a light-emitting layer interposed therebetween. The semiconductor layered body including such a light-emitting layer is, for example, $In_xAl_yGa_{1-x-y}N$ ($0≤x$, $0≤y$, and $x+y≤1$).

The semiconductor layered body 121 may have a structure including one or more light-emitting layers between the n-type semiconductor layer and the p-type semiconductor layer, or may have a structure in which a structure including the n-type semiconductor layer, the light-emitting layer, and the p-type semiconductor layer in this order is repeated multiple times. When the semiconductor layered body 121 includes the plurality of light-emitting layers, the semiconductor layered body 121 may include the light-emitting layers having different light emission peak wavelengths, or may include the light-emitting layers having the same light emission peak wavelength. Note that having the same light emission peak wavelength includes a case in which there is a variation of about a few nm. A combination of light emission peak wavelengths between the plurality of light-emitting layers can be selected as appropriate. For example, when the semiconductor layered body includes two light-emitting layers, light-emitting layers can be selected in combination of blue light and blue light, green light and green light, red light and red light, ultraviolet light and ultraviolet light, blue light and green light, blue light and red light, or green light and red light.

The light-emitting element 12 includes the pair of positive and negative electrodes 122 on the lower surface of the semiconductor layered body 121. A good conductor of electricity can be used for the electrodes 122, and the electrodes 122 can be made of, for example, gold, silver, tin, platinum, rhodium, titanium, aluminum, tungsten, palladium, nickel, or an alloy thereof. The electrodes 122 may include an ohmic electrode that is in contact with the lower surface of the semiconductor layered body 121 and a pad electrode connected to the ohmic electrode and connected to the outside. The thickness of the electrodes may be in a range from 10 μm to 50 μm, for example.

Wavelength Conversion Member

The wavelength conversion member 13 contains a wavelength conversion substance that absorbs light from the light-emitting element 12 and converts it into light having a different wavelength. The wavelength conversion member 13 is disposed directly on the upper surface of the light-emitting element 12 or indirectly via the light guide member 15 which will be described later.

The wavelength conversion member 13 has a quadrangular shape in a plan view. The thickness of the wavelength conversion member 13 can be appropriately selected in accordance with the type and amount of phosphor used, the target chromaticity, and the like. The thickness of the wavelength conversion member 13 can be, for example, in a range from 20 μm to 200 μm.

The wavelength conversion member 13 can be formed by mixing a phosphor as the wavelength conversion substance and a light-transmissive material, such as resin, glass, or an inorganic material, as a binder. As the light-transmissive material, for example, a resin material such as an epoxy resin, a silicone resin, a phenolic resin, or a polyimide resin or an inorganic material such as glass or a ceramic can be used. A base material such as a light-transmissive resin material, a ceramic, glass, or the like, and a phosphor as the wavelength conversion substance are included. As the base material, for example, a thermosetting resin such as a silicone resin, a silicone modified resin, an epoxy resin, or a phenolic resin can be used. Further, a thermoplastic resin such as a polycarbonate resin, an acrylic resin, a methyl pentene resin, or a polynorbornene resin can be used. The light-transmissive material preferably has a transmittance of 70% or more, more preferably 80% or more, and even more preferably 90% or more with respect to the light from the light-emitting element.

The phosphor used absorbs light from the light-emitting element 12 and converts it into light having a different wavelength. In other words, the phosphor capable of being excited by the light emitted from the light-emitting element 12 is used. For example, examples of the phosphor that can be excited by the light emitted from a blue light-emitting element or an ultraviolet light-emitting element include cerium-activated yttrium aluminum garnet based phosphors (YAG:Ce), cerium-activated lutetium aluminum garnet based phosphors (LAG:Ce), europium- and/or chromium-activated nitrogen-containing calcium aluminosilicate based phosphors ($CaO—Al_2O_3—SiO_2$), europium-activated silicate based phosphors (($Sr$, $Ba)_2SiO_4$), nitride based phosphors such as β-SiAlON phosphors, CASN based phosphors, and SCASN based phosphors, KSF based phosphors ($K_2SiF_6$:Mn), sulfide based phosphors, and quantum dot phosphors. By combining these phosphors with blue or ultraviolet light-emitting elements, light-emitting devices of various colors (e.g., a white-based light-emitting device) can be manufactured. One or more kinds of these phosphors can be used. When more than one phosphor is used, they may be mixed or layered. Various kinds of fillers or the like may be contained in the wavelength conversion member.

First Reflective Member/Second Reflective Member/Third Reflective Member/Covering Member The first reflective member 11, the second reflective member 21, the third reflective member 31, and the covering member 14 are all light reflective members, and are hereinafter collectively referred to as a "reflective member". The reflective member is a member that can reflect light from a light-emitting element, and for example, a resin material or inorganic material containing a light reflective material can be used. The reflective member preferably has a reflectance of 70% or more, preferably 80% or more, and more preferably 90% or more with respect to the light from the light-emitting element.

For the reflective member, for example, a resin material whose main component is a thermosetting resin such as a silicone resin, a silicone modified resin, an epoxy resin, or a phenolic resin can be used as the base material of the reflective member. As a light reflective material to be contained in the base material, a white substance can be used, for example. Specifically, for example, titanium oxide, silicon oxide, zirconium oxide, potassium titanate, aluminum oxide, aluminum nitride, boron nitride, mullite, or the like is preferable. The light reflective material may be in the form of particles, fibers, flakes, or the like.

Alternatively, the reflective member may be made of, for example, a mixture of inorganic substances including boron nitride and alkali metal silicate. The mixture can be produced by mixing mixed powder of boron nitride powder and silicon oxide powder with an alkaline solution (e.g., potassium hydroxide), followed by heat curing. In the case of potassium hydroxide as the alkaline solution, heat curing causes the silicon oxide and potassium hydroxide to react with each other to form potassium silicate, which is an alkali metal silicate. Boron nitride is a member capable of reducing shrinkage of the mixture during heat curing. Aluminum oxide can be used instead of boron nitride.

When the third portion 30 includes the third reflective member 31 and the base 32, the light reflective material described above can be disposed on a part or all of the surface of the base 32, as a thin layer, by sputtering, vapor deposition, or the like.

Light-Transmissive Member

The light-transmissive member 22 is a portion serving as the light-extracting surface of the light-emitting device 100. As the light-transmissive member 22, for example, a resin material such as an epoxy resin, a silicone resin, a phenolic resin, or a polyimide resin or an inorganic material such as glass or a ceramic can be used. The light-transmissive member 22 preferably has a transmittance of 70% or more, more preferably 80% or more, and even more preferably 90% or more with respect to the light from the light-emitting element 12. The light-transmissive member 22 may have a flat plate shape or a shape having a lens function. Examples of the shape having a lens function include a convex lens shape, a concave lens shape, a Fresnel lens shape, and the like.

Base

The base 32 is a member included in the third portion 30 and is a portion serving as a base of the third reflective member 31. As the base 32, for example, a resin material such as an epoxy resin, a silicone resin, a phenolic resin, or a polyimide resin or an inorganic material such as glass or a ceramic can be used.

Bonding Member

The bonding member 40 is a member that bonds the first portion 10 and the second portion 20. Alternatively, the bonding member 40 is a member that bonds the first portion 10 and the third portion 30, and bonds the second portion 20 and the third portion 30. As the bonding member 40, for example, a resin material such as an epoxy resin, a silicone resin, a phenolic resin, or a polyimide resin can be used. The bonding member 40 may contain titanium oxide, silicon oxide, zirconium oxide, potassium titanate, aluminum oxide, aluminum nitride, boron nitride, mullite, or the like in such a resin material. The bonding member preferably has a reflectance of 70% or more, more preferably 80% or more, and even more preferably 90% or more with respect to the light from the light-emitting element.

Light Guide Member

The light guide member 15 is a member that bonds the light-emitting element 12 and the wavelength conversion member 13. The light guide member 15 is disposed between the upper surface of the light-emitting element 12 and the lower surface of the wavelength conversion member 13. The light guide member 15 may further cover the lateral surface of the light-emitting element 12. As the light guide member 15, a light-transmissive resin material can be used. For example, a resin material whose main component is a thermosetting resin, such as a silicone resin, a silicone modified resin, an epoxy resin, or a phenolic resin, is preferable. The light guide member 15 preferably has a transmittance of 70% or more, more preferably 80% or more, and even more preferably 90% or more with respect to the light from the light-emitting element. In the case of bonding the light-emitting element 12 and the wavelength conversion member 13 by a direct bonding method, the light guide member 15 can be omitted.

Substrate

The light-emitting device 100 can include the substrate 50. The substrate 50 is a plate-like member including a base material and electrically conductive wiring disposed on the base material. The first portion 10 is disposed on the upper surface of the substrate 50. As the base material, for example, an insulating material such as glass epoxy, a resin, a ceramic, or the like, a semiconductor material such as silicon, or an electrically conductive material such as copper is used. In particular, a ceramic, which has high heat resistance and light resistance, can be preferably used. Examples of a ceramic include aluminum oxide, aluminum nitride, silicon nitride, LTCC, and the like. In addition, a composite material of such an insulating material, a semiconductor material, and an electrically conductive material may also be used. When the semiconductor material or the electrically conductive material is used as the base material, the wiring line can be disposed over the upper surface of the base material via the insulating layer. Examples of the material of the wiring line include metals such as Fe, Cu, Ni, Al, Ag, Au, Pt, Ti, W, and Pd, and alloys containing at least one kind of them.

What is claimed is:

1. A light-emitting device comprising:
a first portion including
  a light-emitting element,
  a wavelength conversion member disposed on an upper surface of the light-emitting element, and
  a first reflective member covering a lateral surface of the light-emitting element and a lateral surface of the wavelength conversion member; and
a second portion including
  a light-transmissive member disposed above the wavelength conversion member via an air layer, and
  a second reflective member disposed around the light-transmissive member in a plan view, wherein
an upper surface of the first reflective member has a first upper surface disposed around the wavelength conversion member and a second upper surface disposed outwardly of the first upper surface in the plan view,
a lower surface of the second reflective member has a first lower surface disposed around the light-transmissive member and a second lower surface disposed outwardly of the first lower surface in the plan view, and
the air layer extends in a region between the first upper surface of the first reflective member and the first lower surface of the second reflective member.

2. The light-emitting device according to claim 1, further comprising:

a third portion including a third reflective member between the first portion and the second portion, wherein the third portion is disposed between the second upper surface of the first reflective member and the second lower surface of the second reflective member, and the air layer is in contact with the third reflective member.

3. The light-emitting device according to claim 1, wherein the second upper surface is positioned higher than the first upper surface in the first reflective member.

4. The light-emitting device according to claim 1, wherein the second upper surface is positioned lower than the first upper surface in the first reflective member.

5. The light-emitting device according to claim 1, wherein the second lower surface is positioned lower than the first lower surface in the second reflective member.

6. The light-emitting device according to claim 1, wherein the second lower surface is positioned higher than the first lower surface in the second reflective member.

7. The light-emitting device according to claim 1, wherein the second upper surface is disposed along an entire periphery on an outside of the first upper surface.

8. The light-emitting device according to claim 1, wherein the second lower surface is disposed along an entire periphery on an outside of the first lower surface.

9. The light-emitting device according to claim 1, wherein the second upper surface is intermittently disposed along a periphery on an outside of the first upper surface.

10. The light-emitting device according to claim 1, wherein the second lower surface is intermittently disposed along a periphery on an outside of the first lower surface.

11. The light-emitting device according to claim 1, wherein the second upper surface is positioned lower than the first upper surface in the first reflective member, and the second lower surface is positioned lower than the first lower surface in the second reflective member.

12. The light-emitting device according to claim 1, wherein the second upper surface is positioned higher than the first upper surface in the first reflective member, and the second lower surface is positioned higher than the first lower surface in the second reflective member.

13. The light-emitting device according to claim 1, wherein the second upper surface and the first upper surface are on the same plane in the first reflective member, and the second lower surface is positioned lower than the first lower surface in the second reflective member.

14. The light-emitting device according to claim 1, wherein the second upper surface is positioned higher than the first upper surface in the first reflective member, and the second lower surface and the first lower surface are on the same plane in the second reflective member.

* * * * *